July 16, 1968 R. W. BENE ET AL 3,393,378
HIGH FREQUENCY OSCILLATOR
Filed April 22, 1966 2 Sheets-Sheet 1

INVENTORS
ROBERT W. BENE
ROBERT G. ROGERS
BY Spencer E. Olson
ATTY.

HIGH FREQUENCY OSCILLATOR

United States Patent Office 3,393,378
Patented July 16, 1968

3,393,378
HIGH FREQUENCY OSCILLATOR
Robert W. Bene, Redwood City, and Robert G. Rogers, Los Altos, Calif., assignors, by mesne assignments, to Automatic Electric Laboratories, Inc., Northlake, Ill., a corporation of Delaware
Filed Apr. 22, 1966, Ser. No. 544,532
2 Claims. (Cl. 331—117)

ABSTRACT OF THE DISCLOSURE

A transistor mounted in a first tuned cavity of a case has its emitter inductively coupled to a second tuned cavity which in turn is coupled to the first cavity and to the collector of the transistor through an aperture in a wall common to the two cavities. These cavities constitute an external negative feedback circuit which neutralizes the effects of internal regenerative feedback within the transistor except at the desired operating frequency of the oscillator at which the cavities provide regenerative feedback.

This invention relates generally to oscillators and more particularly to a high frequency transistor oscillator.

At low frequencies a transistor can be considered to be a simple parametric device; but at high frequencies the parasitic impedances in the internal characteristics of the transistor and the equivalent impedances due to carrier transit time effects come into play. Therefore, at frequencies up to a few megacycles, an ordinary transistor functions quite well in an oscillator or amplifier circuit; but at frequencies approaching one hundred megacycles the ordinary transistor will not operate at all, and specially designed high frequency transistors are required.

At high frequencies these specially designed transistors exhibit internal feedback over a relatively broad band of frequencies. This feedback is regenerative, and it tends to produce oscillations in the transistor. Oscillation is particularly undesirable in an amplifier circuit, and external circuitry, providing out-of-phase feedback which neutralizes the internal feedback, is employed to prevent it. Amplifiers in which this technique is used are termed neutralized amplifiers.

In oscillator circuits regenerative feedback is desirable—indeed it is necessary for sustained oscillation. In low frequency oscillators, external circuitry is used to provide regenerative feedback at the desired frequency of oscillation. In high frequency transistor oscillators, the internal feedback in the transistor is sufficient to produce sustained oscillation, but the bandwidth of the internal feedback is so broad that a relatively wide band of noise is produced in the output signal. In the past this wide band of noise in high frequency transistor oscillators has prohibited their use in certain applications in which low noise sidebands are required. This problem of wideband noise is particularly acute in microwave applications, especially as the desired frequency of oscillation approaches the cutoff frequency of the transistor.

Therefore, it is the principal object of this invention to provide an improved high frequency transistor oscillator.

This invention features a high frequency oscillator employing a high frequency transistor and external circuitry which provides wideband degenerative feedback to neutralize the wideband regenerative internal feedback in the transistor except for frequencies in a narrow band which includes the desired output frequency, and which provides regenerative feedback for frequencies within this narrow band, so that the noise bandwidth of the oscillator is reduced. With this reduced noise bandwidth the high frequency transistor oscillator can meet the low noise requirements of carrier communications systems, whereas formerly it could not meet these requirements. In the microwave field particularly, transistor oscillators with reduced noise bandwidth will receive wider and wider application.

As microwave transistors improve it may be possible to obtain a transistor with a 6 or 8 gc. cutoff frequency to be used in an oscillator with a 2 gc. output frequency. In such a case neutralizing feedback might not be needed since the operating frequency would be much lower than the cutoff frequency. Nethertheless, a 2 gc. transistor would be less expensive; and with neutralizing feedback, it could be used in the same application. Moreover, some of the 6 to 8 gc. transistors manufactured would not be able to meet the low noise requirement by themselves, and the provision of neutralizing feedback would be necessary to use these transistors in a 2 gc. application.

Other objects and features and a complete understanding of this invention will be gained from a consideration of the following description in conjunction with the accompanying drawings, in which.

Figure 1:
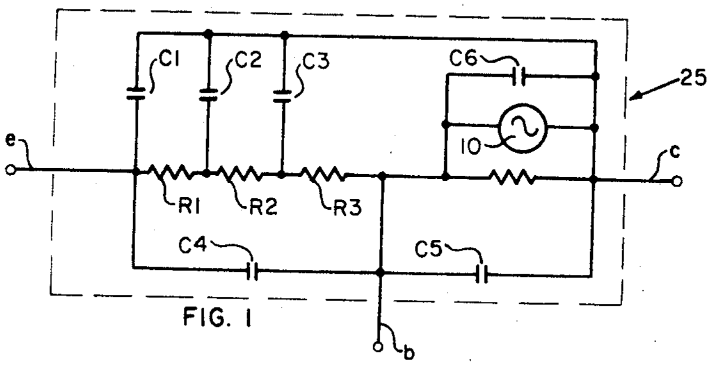
FIG. 1 is an electrical schematic diagram of an equivalent circuit of a high frequency transistor.

In FIG. 1 an equivalent circuit of a high frequency transistor is shown to illustrate the source of wide band internal feedback. The equivalent circuit is not intended to be complete, but it does show the internal feedback mechanism. Resistors R1, R2, and R3, in conjunction with capacitances C1, C2, and C3, approximate the distributed coupling between emitter *e* and collector *c*. This internal feedback mechanism has a negligible effect at lower frequencies; but at microwave frequencies it provides a large, relatively wide band feedback signal path from the collector *c* to the emitter *e*. At microwave frequencies, the reactances of the capacitances in the feedback mechanism are so low that, even with an RF short circuit between emitter and base, energy is still fed back from collector *c* to emitter *e*. Under these short circuit conditions, capacitance C1 would be removed from the feedback mechanism; but due to resistance R1 the capacitance C2 could supply an emitter current, and due to resistances R1 and R2 the capacitance C3 would also supply an emitter current.

The current which is fed back over this internal path is of a phase which causes regeneration; and consequently, this wide band feedback produces a relatively wide band of noise in a high frequency oscillator. It is this relatively wide band of noise which has in the past prevented the use of transistor oscillators in high frequency applications such as are encountered in the microwave field.

Figure 2:
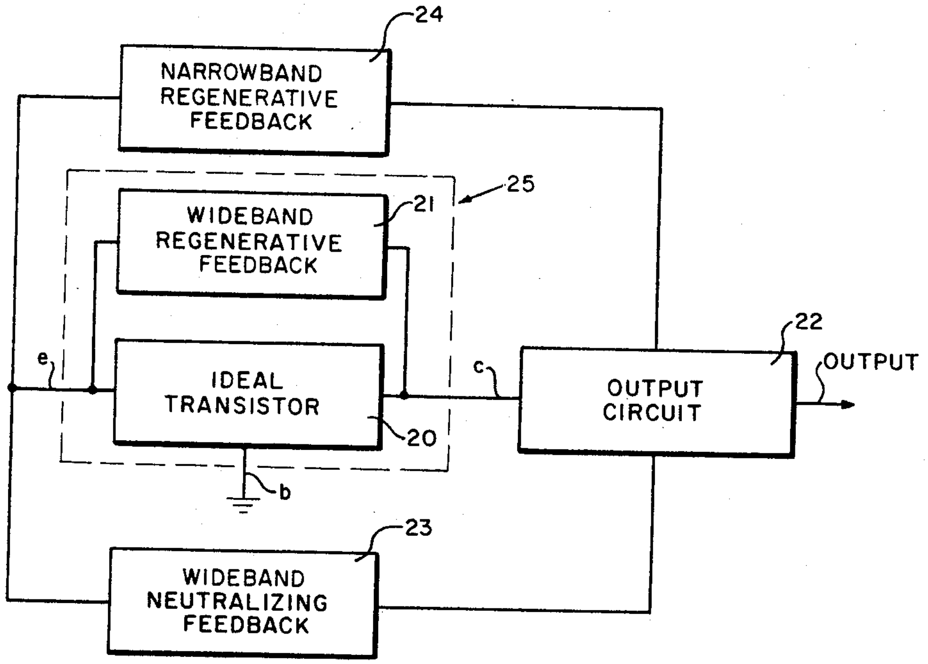
FIG. 2 is a block schematic diagram illustrating the technique involved in this invention.

In accordance with this invention, a technique for solving this problem of wide band noise in a high frequency transistor oscillator is illustrated in FIG. 2. The actual high frequency transistor 25 is shown as the combination of an ideal transistor 20, having infinite isolation between collector *c* and emitter *e*, and a wide band regenerative feedback path 21 between the emitter *e* and collector *c* of the ideal transistor 20. In a conventional high frequency amplifier, wide band neutralizing feedback would be provided to cancel the effects of the regenerative internal feedback, giving effective output-input isolation so that the circuit could not oscillate.

In an oscillator complete neutralization of the wide-band regenerative feedback 21 is not desirable since this would prevent oscillation in the transistor at any of the frequencies involved in the regenerative feedback. However, according to the technique of this invention, wide band neutralizing feedback 23 is provided to cancel the effects of the wide band regenerative feedback 21 which would produce wide band noise in the oscillator, and then narrow band regenerative feedback 24 is provided to give a clean oscillation with greatly reduced noise bandwidth. In effect, a high frequency oscillator constructed according to this technique could be termed a neutralized oscillator.

In practice, because of the transistor and the impedance complexity of the external circuitry, it is difficult to separate the external neutralizing and external regenerative feedback paths. Therefore, in accordance with this invention, the wide band neutralizing feedback and the narrow band regenerative feedback are combined in one feedback circuit which provides neutralizing feedback at all of the frequencies in the wide band of internal feedback except at frequencies in a narrow band which includes the desired frequency of oscillation. In this narrow band the feedback is regenerative so that the result of combining wide band neutralizing with narrow band regeneration is an improved oscillator with a reduced noise bandwidth.

Figure 3:
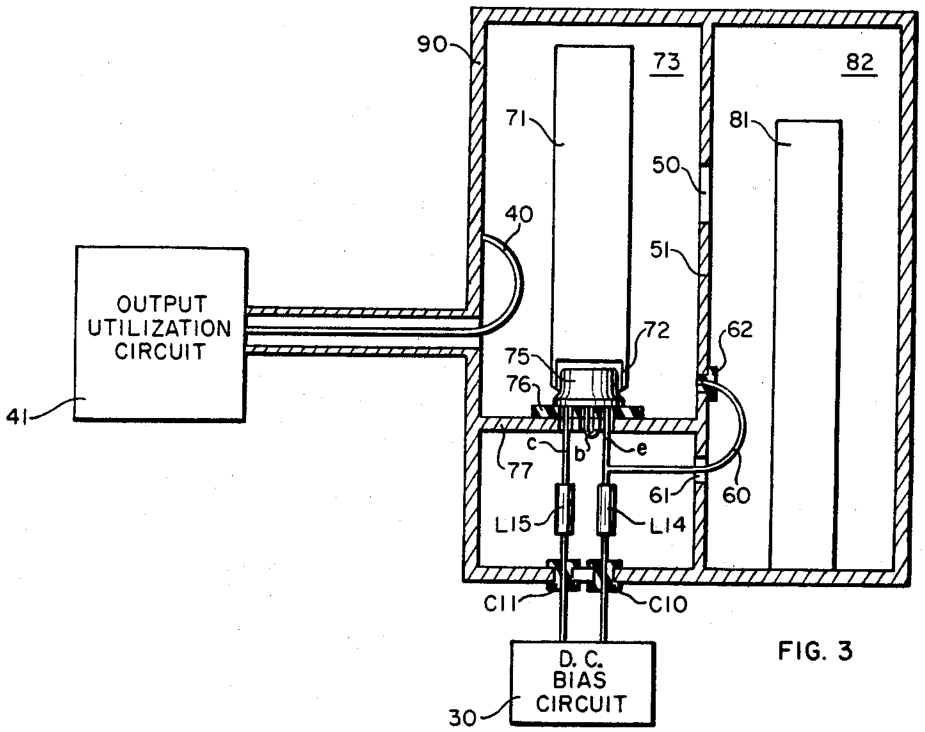
FIG. 3 is a partly sectioned elevational view of a preferred embodiment of the invention.

In FIG. 3, as a preferred embodiment, a microwave transistor oscillator is shown. The actual microwave transistor is located within the case 75. This case 75 is mounted on an insulating ring 76 which is, in turn, mounted on the bottom wall 77 of the cavity 73. The insulating ring 76 is required to prevent a D.C. short circuit since the transistor case 75 is at the collector potential and the wall 77 is at ground potential. The collector lead *c*, the base lead *b*, and the emitter lead *e* are brought out from the bottom of the case 75 through holes in the insulating ring 76 and the bottom wall 77. The collector lead *c* and the emitter lead *e* are connected through inductors L15 and L14, respectively, and through bypass capacitors C11 and C10, respectively, into the D.C. bias circuit 30. The inductors L14 and L15 and the capacitors C10 and C11 provide decoupling circuits for the collector lead *c* and the emitter lead *e*. The base lead is connected by a very short lead to the wall 77 which is at frame ground. The emitter lead *e* is also connected by way of coupling loop 60 through the aperture 61 into the cavity 82. The coupling loop 60 is connected to the grounded wall 51 through the bypass capacitor 62 to prevent short circuiting of the D.C. bias circuit.

The tuned line 71 in the cavity 73 is connected to the transistor case 75 by means of spring fingers 72. The length of the line 71 is determined by the frequency to which the cavity 73 is to be tuned. The tuned line 81 in cavity 82 is connected directly to the frame 90, and its length is determined by the frequency to which the cavity 82 is to be tuned. The iris 50 in the internal wall 51 provides for signal coupling between the cavity 73 and the cavity 82. The output coupling loop 40 couples the signal from the cavity 73 into the output utilization circuit 41.

Figures 4, 5:
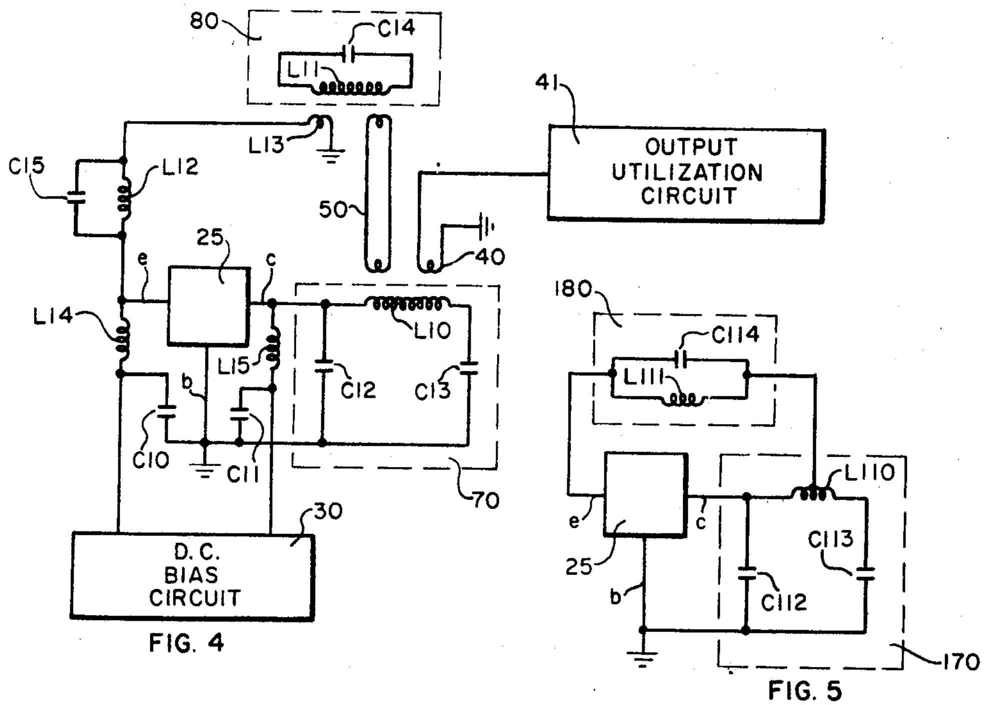
FIG. 4 is an electrical schematic diagram of an equivalent circuit of the embodiment shown in FIG. 3.
FIG. 5 is an electrical schematic diagram of an alternate embodiment of the invention.

The operation of the microwave transistor amplifier shown in FIG. 3 can best be described with reference to the equivalent circuit shown in FIG. 4. In FIG. 4, the actual transistor including wide band internal feedback is shown as the block 25 with the emitter lead *e*, collector lead *c* and base lead *b* coming out of the block. As shown, the transistor is connected in a grounded base configuration. The inductor L15 and the capacitor C11 provide the bias decoupling circuit between the collector lead *c* and the bias circuit 30; and the inductor L14 and capacitance C10 provide the decoupling circuit between the emitter lead *e* and the bias circuit 30. These inductances and capacitances correspond directly to the identically designated inductances and capacitances shown in FIG. 3.

The tuned circuit 70, connected to the collector of the transistor 25, represents the tuned cavity 73 including the line 71 connected to the transistor case 75. A pi network comprised of capacitances C12 and C13 and inductance L10 is shown in tuned circuit 70 since it more nearly approximates the tuned cavity 73. The output coupling loop 40 corresponds to the output coupling loop 40 in FIG. 3. The tuned circuit 80, comprising capacitance C14 and inductance L11 is the equivalent of the tuned cavity 82 including the line 81. Link coupling 50 is shown between the inductance L11 and the inductance L10 as the equivalent of the coupling iris 50 shown in FIG. 3, although in practice, the iris 50 may be coupling electric as well as magnetic fields. The emitter coupling loop 60 shown in FIG. 3 is represented by capacitance C15, inductance L12, and inductance L13. Capacitance C15 and inductance L12 are included since the actual coupling loop 60 is an appreciable fraction of a wavelength long and, therefore, has some finite reactance. At the operating frequency of the oscillator, however, the emitter coupling loop 60 probably appears as a net inductance.

The signal output at the collector of the transistor 25 is fed back to the emitter through tuned circuit 70, the loop 50, and tuned circuit 80. The tuned circuits are tuned to the desired output frequency of the oscillator so that the feedback is regenerative at that output frequency and in a narrow band of frequencies around it. However, at the other frequencies in a wide band around this narrow band, the feedback is degenerative to neutralize the regenerative internal feedback at these other frequencies.

The actual signal feedback in the physical embodiment shown in FIG. 3 takes place through the tuned cavity 73, the coupling iris 50, the tuned cavity 83, and the emitter coupling loop 60. The tuned cavities 73 and 83 are tuned to the desired output frequency so that the operation described above is obtained. The result of this combination of wide band neutralization and narrow band regeneration is a microwave transistor oscillator which has a greatly reduced noise band width.

In an actually built oscillator incorporating a microwave transistor and operating at about 1.2 gc., the addition of the external feedback circuit in accordance with the invention reduced noise in a three kc. band one megacycle off the oscillator output frequency by at least 12 db.

In FIG. 5, a possible alternative embodiment of the invention is shown. In this circuit, the feedback from the collector *c* to the emitter *e* is by way of the output tuned circuit 170 connected to the collector *c* and a feedback tuned circuit 180 connected between the inductance L110 in the tuned circuit 170 and the emitter *e* of the transistor 25. The collector and emitter bias decoupling circuits are not shown in this figure, but they would be identical to those shown in FIG. 4. The operation of the circuit of FIG. 5 is very similar to the operation of the circuit shown in FIG. 4, and the circuit could be embodied in a microwave transistor oscillator structure somewhat similar to that shown in FIG. 3. However, the circuit in FIG. 5 could also be used to provide an oscillator for other high frequency applications.

It is to be emphasized that, although a preferred embodiment of this invention comprising a microwave transistor oscillator has been disclosed, the technique of this invention has broad applicability to transistor oscillator circuits and, therefore, numerous modifications could be made without departing from the scope of this invention as claimed in the following claims.

What is claimed is:

1. A transistor oscillator comprising
a transistor constructed to oscillate at a frequency in the microwave region at which broadband internal regenerative feedback occurs in the transistor,
means for operating said transistor in said microwave region, and a combined negative and positive feedback circuit external to said transistor operatively connecting the output of the transistor to its input.

2. Apparatus for generating an oscillating signal at a predetermined high frequency comprising:

a transistor with emitter input, collector, and base electrodes, said transistor having a cutoff frequency greater than said predetermined frequency and having regenerative internal feedback for signals with frequencies in a wide band including said predetermined frequency;

biasing circuit means for biasing said transistor to a preselected operating point;

feedback means coupled to said transistor operative to provide neutralizing feedback for all signals with frequencies in said wide band except signals with frequencies in a narrow band including said predetermined frequency and to provide regenerative feedback for all signals with frequencies in said narrow band whereby the noise bandwidth of said apparatus is reduced, said feedback means comprising a first and a second tuned cavity, said cavities having a common wall therebetween, first means operative to couple signals between said first tuned cavity and said collector electrode, an iris in said common wall operative to couple signals between said first tuned cavity and said second tuned cavity, and third means operative to couple signals between said second tuned cavity and said emitter electrode, both of said tuned cavities being tuned to said predetermined high frequency.

References Cited

UNITED STATES PATENTS

| | | | |
|---|---|---|---|
| 2,771,584 | 11/1956 | Thomas | 332—29 |
| 3,286,195 | 11/1966 | Bachnick et al. | 332—29 |
| 2,909,731 | 10/1959 | Franck | 331—97 |
| 3,042,870 | 7/1962 | Minner et al. | 331—117 |
| 3,271,698 | 9/1966 | Adams. | |

FOREIGN PATENTS

| | | |
|---|---|---|
| 133,275 | 6/1949 | Australia. |
| 716,201 | 8/1965 | Canada. |

OTHER REFERENCES

"Electronic Design," page 72, July 20, 1964.

JOHN KOMINSKI, *Primary Examiner.*